United States Patent
Merilo et al.

(10) Patent No.: US 9,281,300 B2
(45) Date of Patent: Mar. 8, 2016

(54) CHIP SCALE MODULE PACKAGE IN BGA SEMICONDUCTOR PACKAGE

(75) Inventors: Leo A. Merilo, Singapore (SG);
Emmanuel A. Espiritu, Singapore (SG);
Dario S. Filoteo, Jr., Singapore (SG);
Rachel L. Abinan, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 668 days.

(21) Appl. No.: 12/882,728

(22) Filed: Sep. 15, 2010

(65) Prior Publication Data
US 2011/0001240 A1    Jan. 6, 2011

Related U.S. Application Data

(63) Continuation of application No. 11/464,699, filed on Aug. 15, 2006, now abandoned.

(51) Int. Cl.
*H01L 23/52* (2006.01)
*H01L 25/16* (2006.01)
(Continued)

(52) U.S. Cl.
CPC .............. *H01L 25/162* (2013.01); *H01L 24/49* (2013.01); *H01L 23/3128* (2013.01); *H01L 25/0657* (2013.01); *H01L 2224/16145* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/49* (2013.01); *H01L 2224/73253* (2013.01); *H01L 2224/73265* (2013.01); *H01L 2924/00014* (2013.01); *H01L 2924/014* (2013.01); *H01L 2924/01005* (2013.01); *H01L 2924/01006* (2013.01); *H01L 2924/01014* (2013.01); *H01L 2924/01033* (2013.01); *H01L 2924/14* (2013.01); *H01L 2924/1433* (2013.01); *H01L 2924/15151* (2013.01); *H01L 2924/15153* (2013.01);
(Continued)

(58) Field of Classification Search
CPC .................. H01L 25/162; H01L 24/49; H01L 2224/73253; H01L 2924/15321; H01L 2924/15153; H01L 2224/16145; H01L 2924/19107; H01L 2924/014; H01L 2924/01033; H01L 2924/01006; H01L 25/0657; H01L 2224/73265; H01L 2924/01005; H01L 2924/15151; H01L 2224/1622
USPC .......... 257/778, 685, 686, 777, 723, 724, 731, 257/733, 675, 706, 712, 782–783, 784, 786, 257/787, 796, E25.006, E25.013, E25.018, 257/E25.021, E25.027, E23.085, E21.614, 257/E33.075
See application file for complete search history.

(56) References Cited

U.S. PATENT DOCUMENTS

5,977,640 A * 11/1999 Bertin et al. ................... 257/777
6,704,609 B1 * 3/2004 Shen ............................. 700/121
(Continued)

*Primary Examiner* — Ermias Woldegeorgis
(74) *Attorney, Agent, or Firm* — Robert D. Atkins; Patent Law Group: Atkins and Associates, P.C.

(57) ABSTRACT

A semiconductor package includes a ball grid array (BGA) substrate having integrated metal layer circuitry, a flip chip chip scale module package (CSMP) having a first integrated passive device (IPD), the flip chip chip scale module package attached to the BGA substrate, and an application die attached to the IPD. A method of manufacturing a semiconductor package includes providing a BGA substrate having integrated metal layer circuitry, attaching a flip chip CSMP having a first IPD to the BGA substrate, and attaching an application die to the IPD.

15 Claims, 11 Drawing Sheets

(51) Int. Cl.
  *H01L 23/00*  (2006.01)
  *H01L 23/31*  (2006.01)
  *H01L 25/065*  (2006.01)

(52) U.S. Cl.
  CPC .............. *H01L2924/15311* (2013.01); *H01L 2924/15321* (2013.01); *H01L 2924/181* (2013.01); *H01L 2924/19041* (2013.01); *H01L 2924/19107* (2013.01)

(56) References Cited

U.S. PATENT DOCUMENTS

| | | | |
|---|---|---|---|
| 6,798,049 B1 * | 9/2004 | Shin | H01L 23/13 257/676 |
| 6,921,968 B2 | 7/2005 | Chung | |
| 6,989,586 B2 | 1/2006 | Agraharam et al. | |
| 7,078,788 B2 | 7/2006 | Vu et al. | |
| 7,129,583 B2 | 10/2006 | Tao et al. | |
| 2002/0027295 A1 | 3/2002 | Kikuma et al. | |
| 2002/0125558 A1 * | 9/2002 | Akram et al. | 257/686 |
| 2002/0127771 A1 * | 9/2002 | Akram et al. | 438/107 |
| 2003/0047798 A1 * | 3/2003 | Halahan | 257/685 |
| 2003/0141583 A1 | 7/2003 | Yang | |
| 2003/0160316 A1 * | 8/2003 | Shieh et al. | 257/686 |
| 2004/0183179 A1 * | 9/2004 | Shieh | H01L 23/3128 257/686 |
| 2004/0183181 A1 | 9/2004 | Sweterlitsch | |
| 2004/0212067 A1 | 10/2004 | Wang | |
| 2005/0062173 A1 * | 3/2005 | Vu et al. | 257/787 |
| 2005/0139979 A1 * | 6/2005 | Tao et al. | 257/686 |
| 2005/0233571 A1 * | 10/2005 | Tao et al. | 438/614 |
| 2005/0242422 A1 * | 11/2005 | Klein et al. | 257/686 |
| 2005/0248019 A1 | 11/2005 | Chao et al. | |
| 2005/0285254 A1 * | 12/2005 | Buot et al. | 257/700 |
| 2006/0220206 A1 | 10/2006 | Gerber et al. | |

* cited by examiner

FIG. 9

CHIP SCALE MODULE PACKAGE IN BGA SEMICONDUCTOR PACKAGE

CLAIM TO DOMESTIC PRIORITY

The present application is a continuation of U.S. patent application No. 11/464,699, now abandoned, filed Aug. 15, 2006, and claims priority to the foregoing parent application pursuant to 35 U.S.C. §120.

FIELD OF THE INVENTION

The present invention relates in general to semiconductor devices and, more particularly, to multi-chip semiconductor packages that have stacked dies.

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

As the demand for semiconductor devices with low-cost, high performance, increased miniaturization, and greater packaging densities has increased, Multi-Chip Module (MCM) structures have been developed to meet the demand. MCM structures have a number of dies and other semiconductor components mounted within a single semiconductor package. The number of dies and other components can be mounted in a vertical manner, a lateral manner, or combinations thereof.

One such approach is to stack one die on top of another and then enclose the stack of dies in one package. The final package for a semiconductor with stacked dies is much smaller than would result if the dies were each packaged separately. In addition to providing a smaller size, stacked-die packages offer a number of advantages that relate to the manufacturing of the package, such as ease of handling and assembly.

In a stacked-die arrangement, the dies are wire-bonded sequentially, typically with automated wire-bonding equipment employing well-known thermal compression or ultrasonic wire-bonding techniques. During the wire-bonding process, the head of a wire-bonding apparatus applies a downward pressure on a conductive wire held in contact with a wire-bonding pad on the die to weld, or bond, the wire to the bonding pad on the die.

In many cases, stacked-die semiconductors can be fabricated faster and more cheaply than several semiconductors, each having a single die, which perform the same functions. A stacked-die approach is advantageous because of the increase in circuit density achieved.

A variety of semiconductor package configurations having stacked die arrangements are found in the art. However, the configurations currently known could stand to benefit from additional flexibility of implementing subcomponents such as integrated circuits (ICs) and integrated passive devices (IPDs) which can include resistors, capacitors, inductors, filters, and BALUNs. Accordingly, a need exists for a semiconductor package with such increased functionality. Additionally, a need exists for a semiconductor package which promotes higher performance while providing lower cost and a smaller footprint.

SUMMARY OF THE INVENTION

In one embodiment, the present invention is a method of manufacturing a semiconductor device including the steps of providing a ball grid array (BGA) substrate having integrated metal layers, applying a thermal conductive adhesive over a first surface of the BGA substrate, and forming a plurality of first interconnects over the BGA substrate that are electrically connected to the integrated metal layers of the BGA substrate. The method further includes providing a known good chip scale module package (CSMP) over the BGA substrate. Providing the CSMP includes providing a second substrate having a cutout area, a central area, and an outer area. The central area encompasses the cutout area, and the outer area encompassing the central area. Providing the CSMP further includes mounting a first semiconductor die over a first surface of the central area of the second substrate. The first semiconductor die has a resistor, capacitor, inductor, filter, or balun within a substrate of the first semiconductor die. Providing the CSMP further includes forming a plurality of second interconnects electrically connected to a plurality of first contact pads disposed on the first surface of the central area of the second substrate and a plurality of second contact pads disposed on a first surface of the first semiconductor die. Providing the CSMP further includes disposing a second semiconductor die in the cutout area of the second substrate, and forming a plurality of third interconnects electrically connected to a plurality of third contact pads disposed on the second semiconductor die and a plurality of fourth contact pads disposed on the first surface of the first semiconductor die over the cutout area of the second substrate. Providing the CSMP also includes, forming a land grid array (LGA) or BGA on a second surface of the second substrate opposite the first surface of the second substrate. The method further includes electrically connecting the plurality of first interconnects to the LGA or BGA, mounting a third semiconductor die to a second surface of the first semiconductor die opposite the first surface of the first semiconductor die, forming a plurality of fourth interconnects electrically connected to the third semiconductor die and the BGA substrate through a plurality of fifth contact pads on a first surface of the outer area of the second substrate, and attaching a plurality of fifth interconnects to the third semiconductor die and the BGA substrate.

In one embodiment, the present invention is a method of manufacturing a semiconductor device including providing a BGA substrate having integrated metal layers, depositing a thermal conductive adhesive over a first surface of the BGA substrate, forming a plurality of first interconnects connected to the integrated metal layers of the BGA substrate, and providing a second substrate having a cutout area. The second substrate is electrically connected to the plurality of first interconnects. The method further includes mounting a first semiconductor die over a first surface of the second substrate. The first semiconductor die has an IPD within a substrate of the first semiconductor die. The method further includes forming a plurality of second interconnects electrically connected to the first surface of the second substrate and a first surface of the first semiconductor die, disposing a second semiconductor die in the cutout area of the second substrate, forming a plurality of third interconnects to electrically connect the second semiconductor die and the first surface of the first semiconductor die, and mounting a third semiconductor die over the first semiconductor die. The method further includes providing a plurality of fourth interconnects to electrically connect the third semiconductor die to the BGA substrate through a plurality of contact pads on the first surface of an outer area of the second substrate and the plurality of first interconnects. The method also includes providing a plurality of fifth interconnects to electrically connect the third semiconductor die to the BGA substrate.

In another embodiment, the present invention is a method of manufacturing a semiconductor device including providing a thermally-enhanced substrate. The thermally-enhanced substrate has integrated metal layers and a cavity formed through a surface of the thermally-enhanced substrate to a depth less than a thickness of the thermally-enhanced substrate. The method further includes mounting a known good CSMP within the cavity of the thermally-enhanced substrate. The method of manufacturing the CSMP includes providing a second substrate having a cutout area, mounting a first semiconductor die over a first surface of the second substrate, and forming a plurality of first interconnects electrically connected to the first surface of the second substrate and a first surface of the first semiconductor die. The method of manufacturing the CSMP further includes disposing a second semiconductor die in the cutout area of the second substrate. The first or second semiconductor die has an IPD within the substrate of the first or second semiconductor die. The method of manufacturing the CSMP also includes forming a plurality of second interconnects electrically connected to the second semiconductor die and first surface of the first semiconductor die. The method further includes mounting a third semiconductor die over the first semiconductor die with a film or adhesive, and forming a plurality of third interconnects electrically connected to a periphery area of the first surface of the second substrate and the thermally-enhanced substrate. The method also includes forming a plurality of fourth interconnects electrically connected to the second substrate and the third semiconductor die, and forming a plurality of fifth interconnects electrically connected to the third semiconductor die and the thermally-enhanced substrate.

In still another embodiment, the present invention is a semiconductor device including a BGA substrate having integrated metal layers, a plurality of first interconnects connected to the integrated metal layers of the BGA substrate, and a known good CSMP electrically connected to the first interconnects. The CSMP includes a second substrate having a cutout area, a plurality of second interconnects electrically connected to a first surface of the second substrate, and a first semiconductor die electrically connected to the plurality of second interconnects. The CSMP further includes a plurality of third interconnects electrically connected to a first surface of the first semiconductor die, and a second semiconductor die disposed in the cutout area of the second substrate. The second semiconductor die is electrically connected to the third interconnects. The first or second semiconductor die has an IPD. The semiconductor device further includes a third semiconductor die mounted over the CSMP, and a plurality of fourth interconnects electrically connected to the third semiconductor die and the first substrate. The plurality of fourth interconnects connect through a peripheral portion of the second substrate and the plurality of first interconnects. The method further teaches a plurality of fifth interconnects electrically connected to the third semiconductor die and the BGA substrate.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Current semiconductor packaging trends toward delivering towards low cost, smaller size, and higher performance. To help achieve lower cost and smaller size packages with higher performance, the CSMP has been implemented. The present invention utilizes the CSMP to incorporate the CSMP into a standard BGA semiconductor package to provide increased functionality and a smaller package footprint.

Figure 1A:
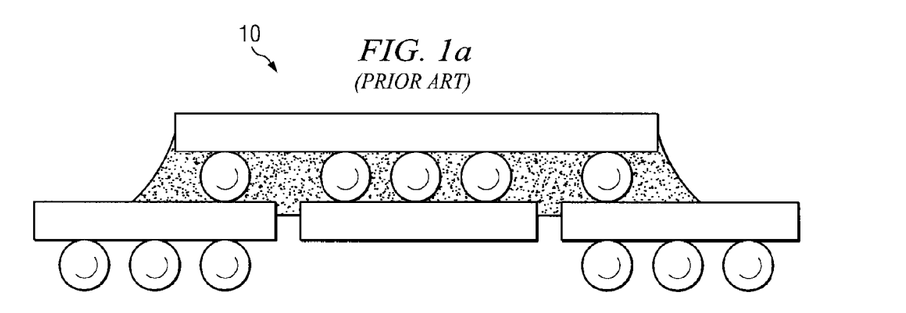
FIG. 1a illustrates an example prior art "Known Good Unit" (KGU) flip chip CSMP.

Turning to FIG. 1a, an example prior art KGU flip chip CSMP package 10 is depicted. Package 10 includes a substrate which is connected to an IPD. The IPD uses a solder interconnect to connect with an integrated semiconductor die.

Chip scale module packaging is an advanced system-in-package (SiP) which features a modular architecture that integrates mixed IC technologies and a wide variety of IPDs such as resistors, capacitors, inductors, filters, BALUNs and interconnects directly onto the silicon substrate.

Figure 1B:
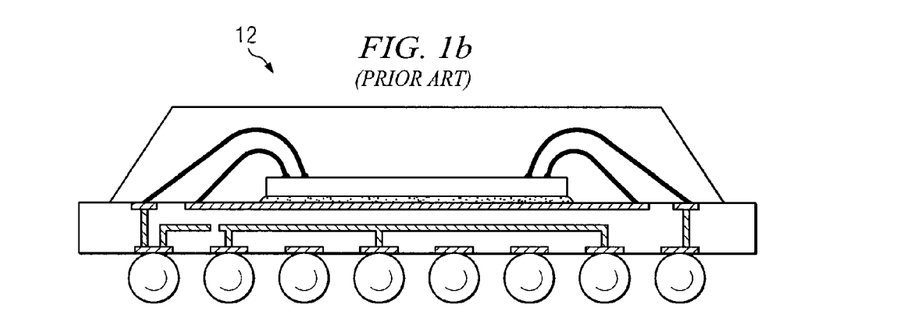
FIG. 1b illustrates an example prior art BGA package.

FIG. 1b depicts an example prior art BGA package 12. Package 12 includes a substrate with integrated metal circuitry connected to an array of solder balls. A die is wirebonded to the substrate, and enclosed with an encapsulant for protection.

Figure 2:
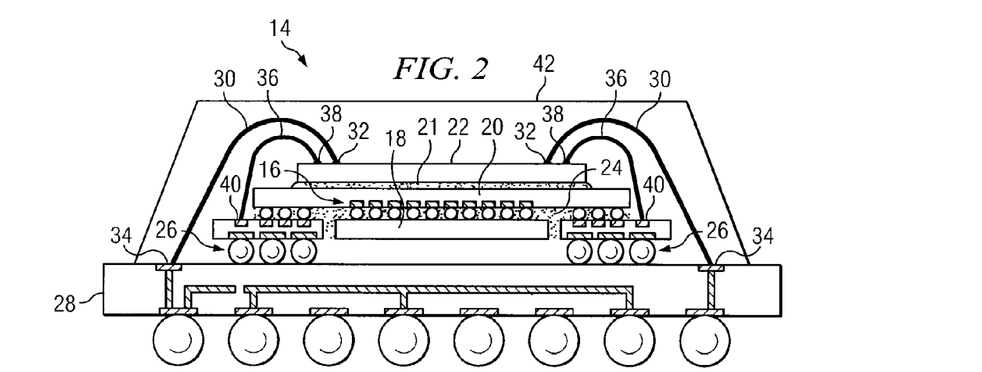
FIG. 2 illustrates an example embodiment of a semiconductor package having an incorporated BGA package together with a KGU flip chip CSMP.

FIG. 2 illustrates an example embodiment of a semiconductor package 14 according to the present invention. Package 14 incorporates a modified BGA package 12 with a modified KGU flip chip CSMP package 16. Package 16 can include either a LGA or a BGA type configuration. Package 16 includes a flip chip die 18 which is incorporated into package 16 as shown. A first application die 20 such as an IC or an IPD as previously described is also incorporated into the package 16. An adhesive material 21 bonds a second application die 22 to the top surface of die 20 as depicted. Dies 20, 22 can be a combination IC/IC, IPD/IPD, or a combination of both IC/IPD. Moreover, additional application dies can be mounted to die 22 in any desired IC/IPD configuration to fulfill a specific need. An underfill material 24 is disposed between die 18 and die 20 to provide structural support.

Package 16 is attached on the BGA substrate 28 by a solder paste, flux, or adhesive material at bump pad 26. To provide connectivity, the application die 22 can use wirebond 30 to connect the wire bond pad 32 of die 22 with the BGA metal layer circuitry and/or bond fingers 34. Similarly, application die 22 can utilize wirebond 36 to connect the wire bond pad 38 to external bond pads and/or bond fingers 40 located on package 16. An encapsulant 42 is formed over package 16 to provide structural support to package 16 within overall package 14.

Package 14 can be constructed utilizing standard molding or TOP mold gate techniques. By combining CSMP package 16 and BGA package 12 into package 14, package 14 can take advantage of the positive aspects of each package to provide enhanced device functionality for applications such as wireless local area networks (WLAN), Bluetooth or similar application specific integrated circuits (ASIC), digital signal processing (DSP), memory applications, gate arrays, PC chipsets, and the like. In addition, package 14 can achieve passive function integration through the use of IPDs which are incorporated on the CSMP module 16 without the use of a standard external passive component.

Figure 3A:
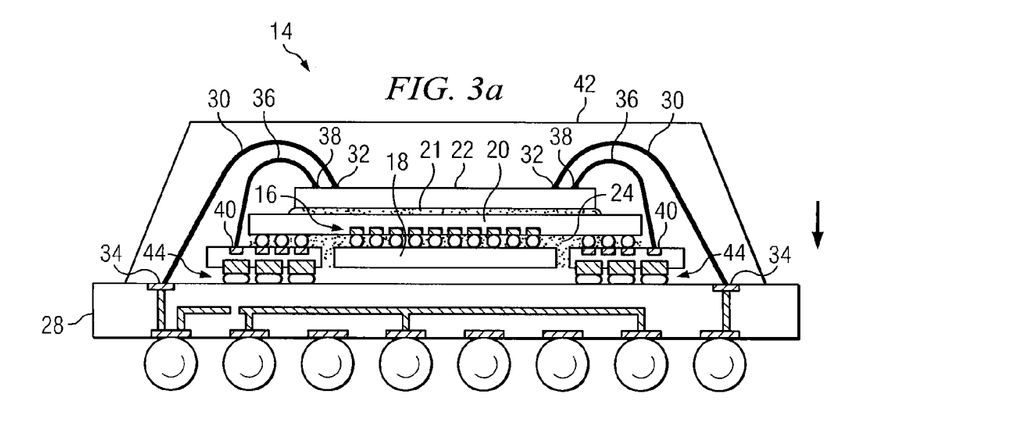
FIG. 3a illustrates an example embodiment of a semiconductor package having an incorporated BGA package together with a KGU flip chip CSMP in a LGA configuration.

Turning to FIG. 3a, an example embodiment of a semiconductor package 14 having an incorporated modified BGA package together with a modified KGU flip chip CSMP utilizing an additional external pad and bond finger configuration is illustrated. Package 14 includes components as illustrated in FIG. 2, such as flip chip die 18, first application die 20, second application die 22, underfill material 24, BGA substrate 28 with incorporated metal circuitry, wire bonding 30, 36 and bond pads 32, 34, 38, and 40. An encapsulant 42 is again disposed over the application dies 20, 22 to provide structural support.

In the depicted embodiment, interconnectivity from the flip chip CSMP external pads to pads located on the BGA substrate 28 is provided at junction 44 using solder paste or a conductive epoxy.

Figure 3B:
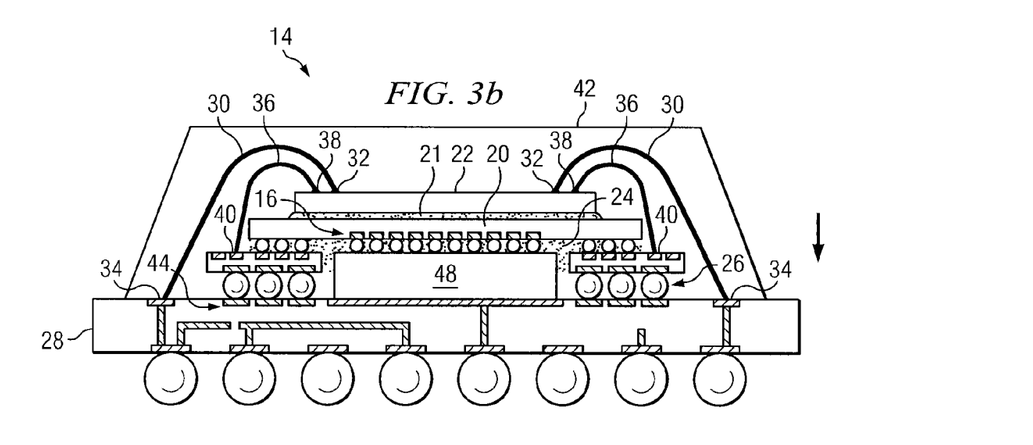
FIG. 3b illustrates an example embodiment of a semiconductor package having an incorporated BGA package together with a KGU flip chip CSMP in a BGA configuration.

FIG. 3b illustrates an example embodiment of a semiconductor package 14 having an incorporated modified BGA package together with a modified KGU flip chip CSMP in a BGA configuration. Here again, package 14 includes many of the same subcomponents as illustrated. Interconnectivity from the flip CSMP solder balls to the BGA bump pads are provided along junction 44 using solder paste, flux, or a conductive epoxy. In the depicted embodiment, package 14 makes use of a grounded flip chip die 48 in place of flip chip die 18 for enhanced thermal performance.

Figure 3C:
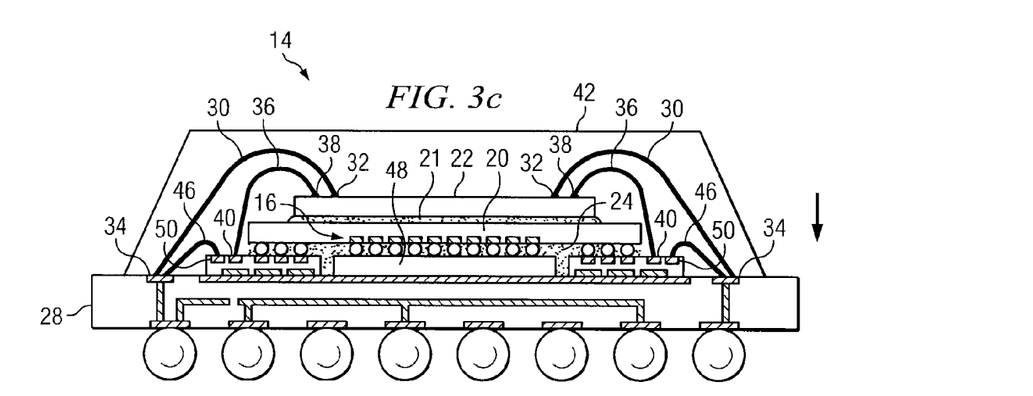
FIG. 3c illustrates an example embodiment of a semiconductor package having an incorporated BGA package together with a KGU flip chip CSMP having an additional external pad and bond finger configuration.

FIG. 3c illustrates an example embodiment of a semiconductor package 14 having an incorporated modified BGA package together with a KGU flip chip CSMP having an additional external pad 50 and bond finger configuration. Interconnectivity from the flip chip CSMP to the BGA substrate is provided using conventional wire bonding. As such, an additional wire bonding 46 is shown connecting external bond pad 50 to bond pad 34.

Figure 4A:
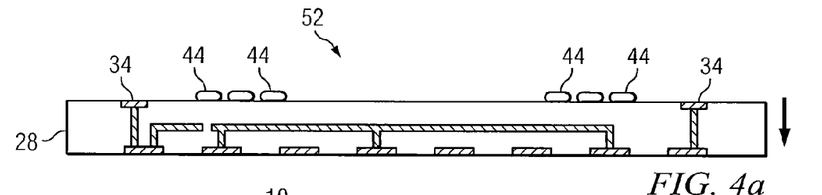
FIG. 4a illustrates a first step in an example method of manufacturing a semiconductor package as illustrated in FIGS. 2, 3a, 3b, or 3c.

FIG. 4a depicts a first step in an example method of manufacturing a semiconductor package as illustrated in FIGS. 2, 3a, 3b, or 3c. A BGA substrate 28 having incorporated metal circuitry is provided. Depending on the configuration, as previously described, solder flux, solder paste, or conductive epoxy is disposed over the substrate 28 at junction 44, to provide interconnectivity between BGA bump pads and the CSMP package. A thermal/conductive adhesive material 52 is also disposed over substrate 28 as depicted to promote adhesion. If a grounded flip chip die 48 is utilized, the use of material 52 is optional.

Figure 4B:
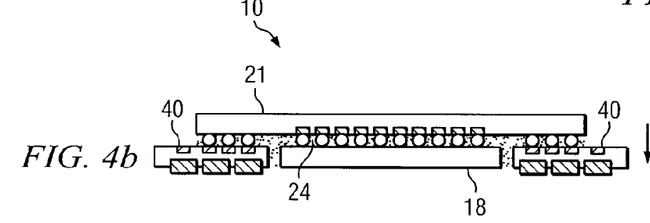
FIG. 4b illustrates a first option of a second step in an example method of manufacturing a semiconductor package as illustrated in FIGS. 2, 3a, 3b, or 3c.
Figure 4C:
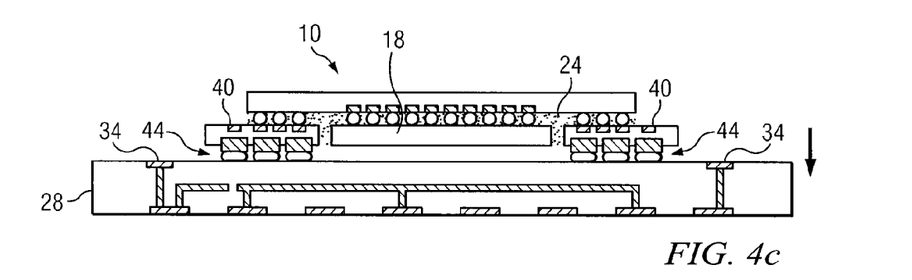
FIG. 4c illustrates a second option of a second step in an example method of manufacturing a semiconductor package as illustrated in FIGS. 2, 3a, 3b, or 3c.

FIG. 4b illustrates a first option of a second step in an example method of manufacturing a semiconductor package as illustrated in FIG. 2, 3a, 3b, or 3c. The option depicted in the present embodiment reflects the use of a LGA-configured flip chip CSMP 10 which is attached to BGA substrate 28 at junction 44. Similarly, FIG. 4c illustrates the second option of the second step in the example method, reflecting the use of a LGA-configured flip chip CSMP 10 which is attached to the BGA substrate 28.

Figure 4D:
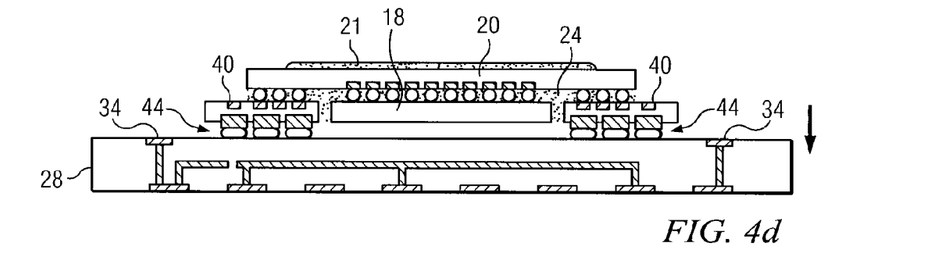
FIG. 4d illustrates a third step in an example method of manufacturing a semiconductor package as illustrated in FIGS. 2, 3a, 3b, or 3c.
Figure 4E:
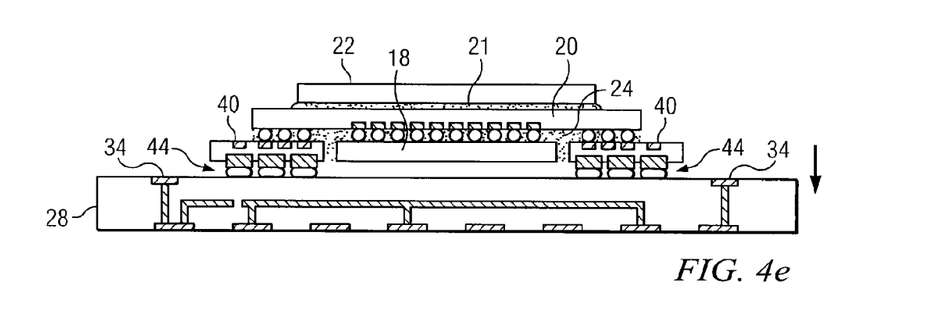
FIG. 4e illustrates a fourth step in an example method of manufacturing a semiconductor package as illustrated in FIGS. 2, 3a, 3b, or 3c.

FIG. 4d illustrates a third step in an example method of manufacturing a semiconductor package as illustrated in FIGS. 2, 3a, 3b, or 3c. A film or adhesive mount 21 is disposed on the backside surface of IPD 20 as shown. FIG. 4e, illustrating a fourth step in the method, depicts the attachment of a second application die 22 to the film 21 as shown.

Figure 4F:
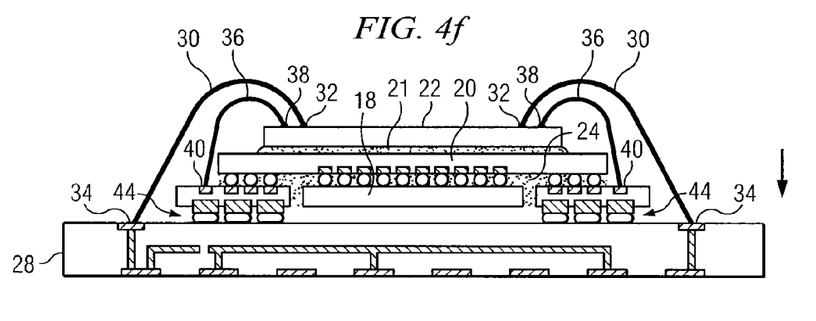
FIG. 4f illustrates a fifth step in an example method of manufacturing a semiconductor package as illustrated in FIGS. 2, 3a, 3b, or 3c.
Figure 4G:
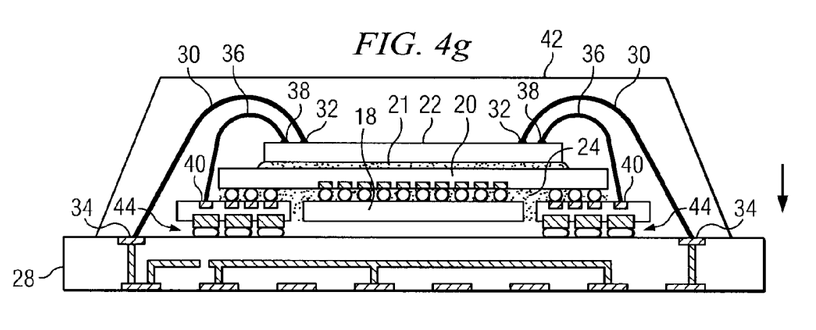
FIG. 4g illustrates a sixth step in an example method of manufacturing a semiconductor package as illustrated in FIGS. 2, 3a, 3b, or 3c.

In the fifth step of the method, FIG. 4f depicts the various wire bonding which provides interconnectivity between bond pads 32, 38 located as part of application die 22 and external bond pads/fingers 34, 40 on the CSMP package and BGA substrate as depicted. As a sixth step, the dies and wirebonding are overmolded with the encapsulant 42 as shown in FIG. 4g.

Figure 5A:
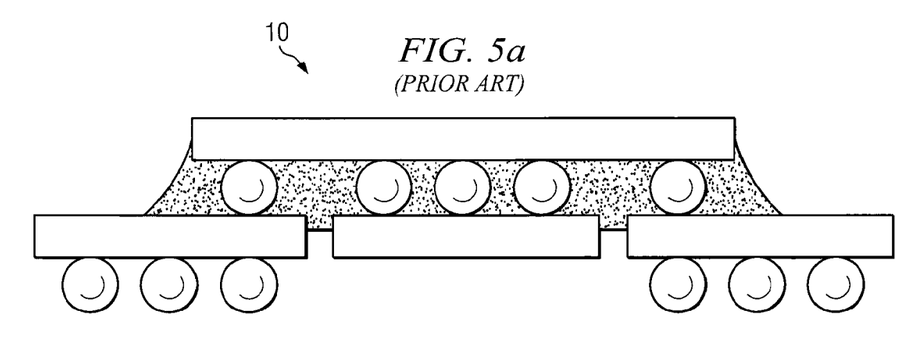
FIG. 5a illustrates an example prior art KGU flip chip CSMP.
Figure 5B:
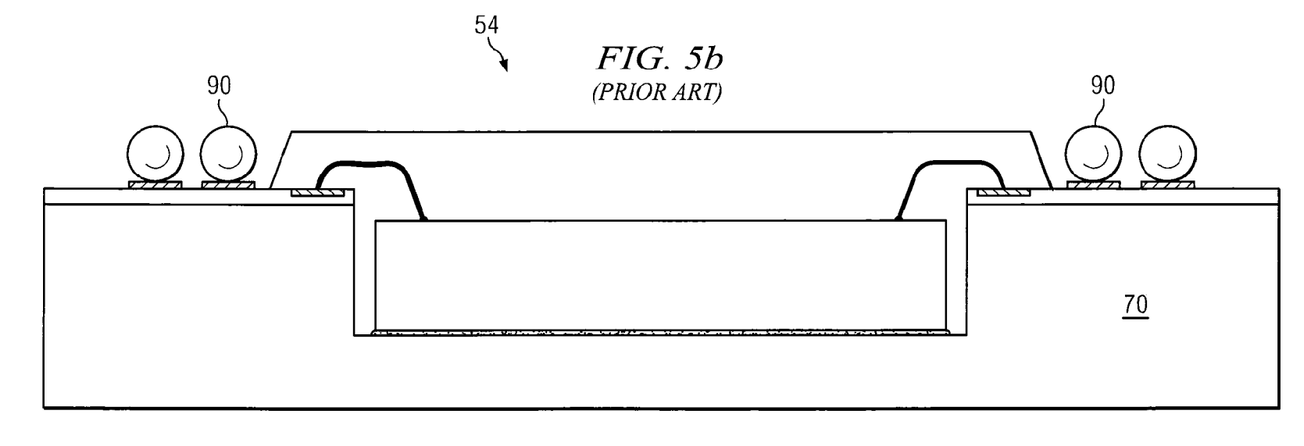
FIG. 5b illustrates an example prior art thermally-enhanced package.

In an additional embodiment, a modified KGU flip chip CSMP can be incorporated in a modified thermally-enhanced package for a particular application. For purposes of conception, FIG. 5a again illustrates an example prior art KGU flip chip CSMP 10 which is used in applications such as WLAN, Bluetooth, GPS, switches, and the like. FIG. 5b refers to an example prior art thermally-enhanced semiconductor package 54 used in applications featuring ASICs, digital signal processing (DSP), microprocessors and controllers, chipsets, or other various applications requiring enhanced thermal performance.

Figure 6:
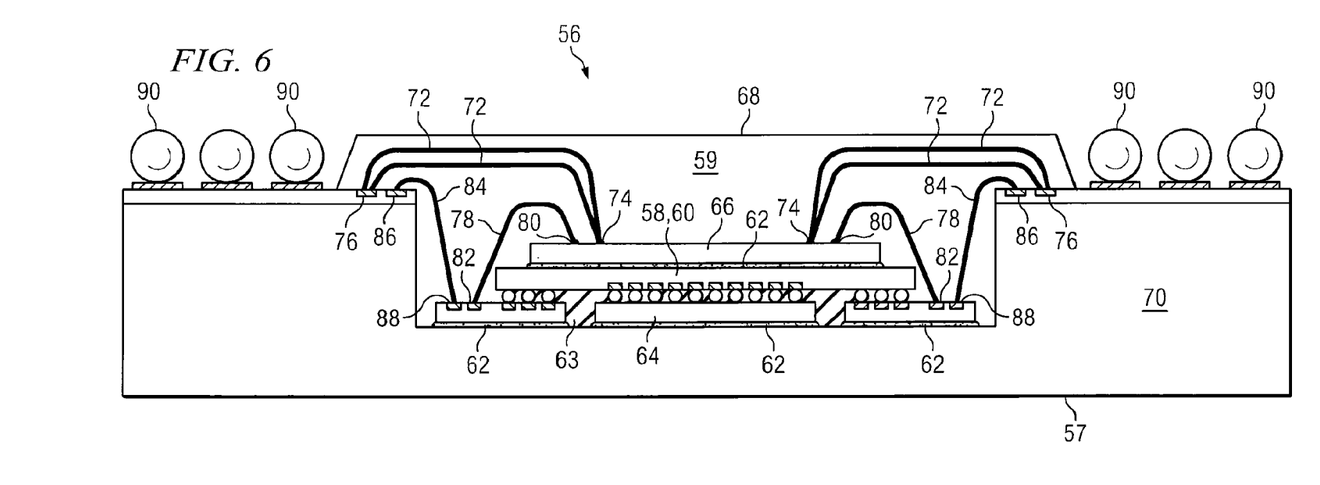
FIG. 6 illustrates an example embodiment of a semiconductor package having an incorporated KGU flip chip CSMP together with a thermally-enhanced package.

FIG. 6 refers to a semiconductor package 56 having a thermally-enhanced substrate 57 which has been adapted for a modified KGU flip chip CSMP package 58. An IPD 60, or IC 60 is integrated into the CSMP package 58. The flip chip CSMP package 58 is attached to substrate 57. Substrate 57 includes a heat sink structure 70 and an integrated cavity 59, as well as metal circuitry incorporated into the substrate 57 to conduct electricity. Package 58 is attached in the cavity by an adhesive material or film 62 which can be thermal or conductive. A high thermal flip chip 64 is incorporated into package 56 as depicted and bonded to the cavity 59 using adhesive 62. An additional die 66, which can include an IC or additional IPD is mounted with adhesive 62 to die 60. Again, as before, dies 60, 66 can include any combination of IC/IC, IPD/IPD, IC/IPD, or IPD/IC. Additional dies (IC or IPD) can be mounted to the top surface of die 66 using a similar approach with adhesive 62. An underfill/encapsulant material 63 is utilized between dies 60, 64 to provide structural support. Similarly, an encapsulant or mold compound 68 is disposed over package 58 to provide structural support to dies 60, 66 within package 58 and the overall package 56.

Wire bonding can be incorporated into package 56 as follows. Wire bonds 72 provide electrical interconnectivity between bond pads 74 located on die 66 and bond pads 76 located as part of the modified thermally-enhanced package. Wire bonds 78 provide electrical connectivity between pads 80, also on die 66, and pads 82, located externally on CSMP package 58. Similarly, wire bonds 84 provide connectivity between pads 86 located as part of the modified thermally-enhanced substrate 57 and pads 88 located externally on modified CSMP package 58. Finally, solder balls 90 provide electrical connectivity to external electrical circuitry as depicted.

Figure 7A:
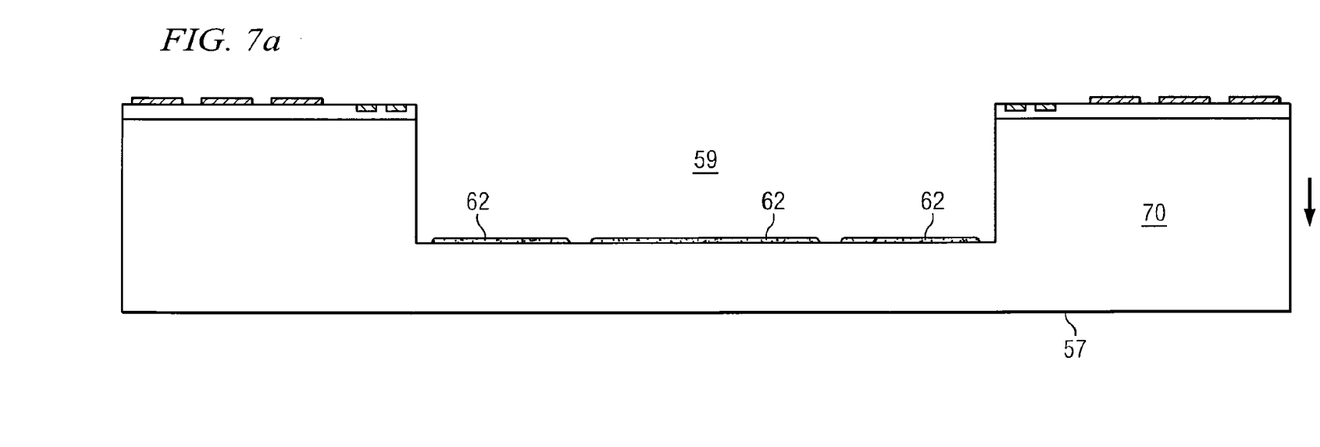
FIG. 7a illustrates a first step in an example method of manufacturing a semiconductor package as illustrated in FIG. 6.
Figure 7B:
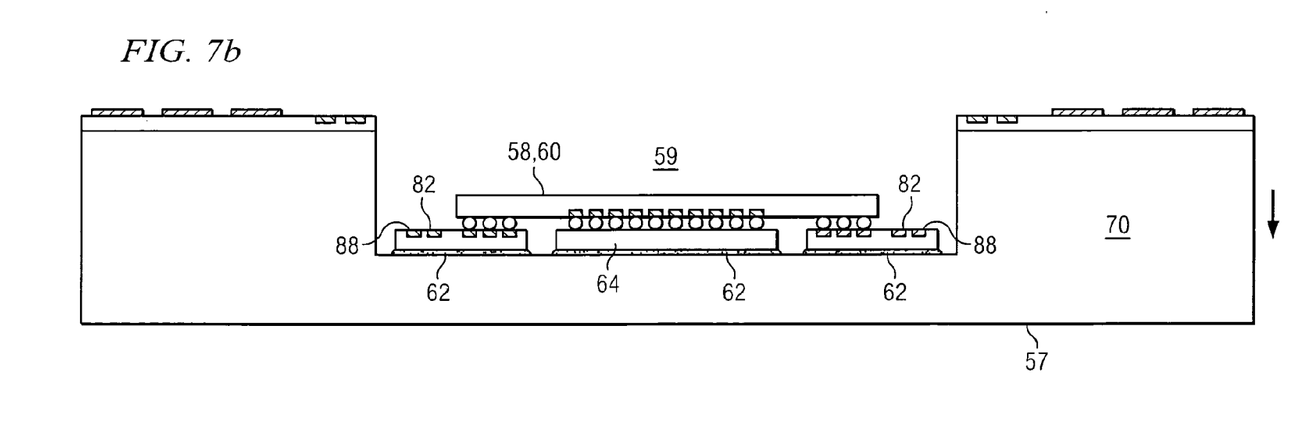
FIG. 7b illustrates a second step in an example method of manufacturing a semiconductor package as illustrated in FIG. 6.
Figure 7C:
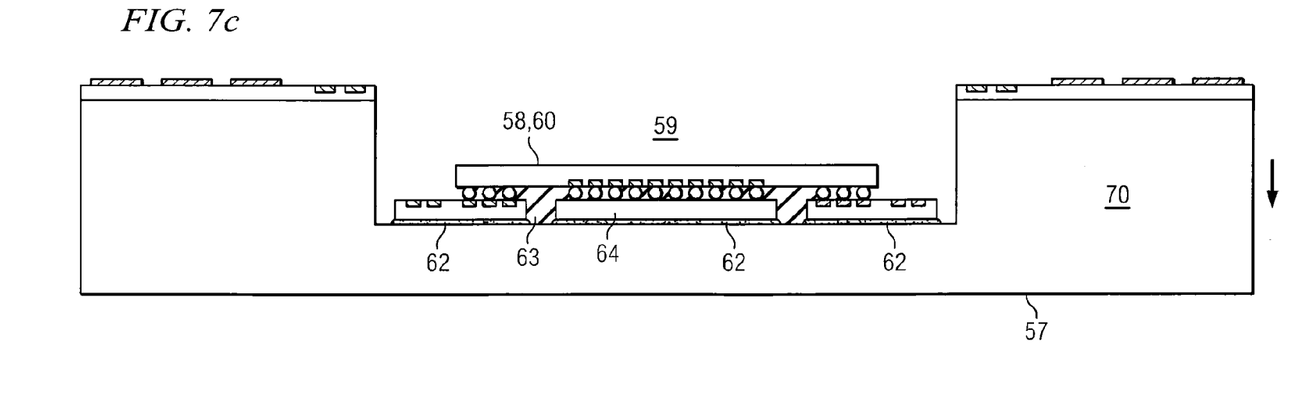
FIG. 7c illustrates a third step in an example method of manufacturing a semiconductor package as illustrated in FIG. 6.
Figure 7D:
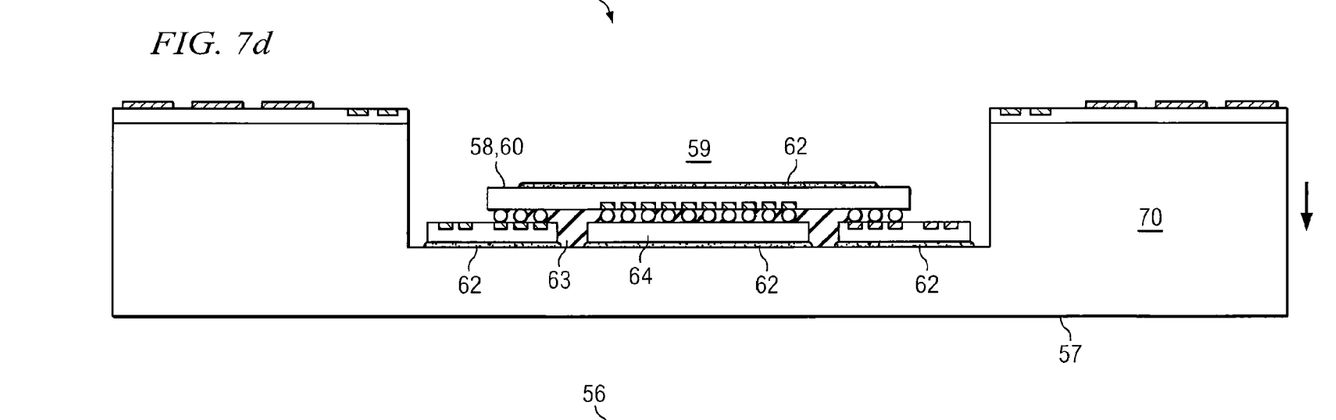
FIG. 7d illustrates a fourth step in an example method of manufacturing a semiconductor package as illustrated in FIG. 6.
Figure 7E:
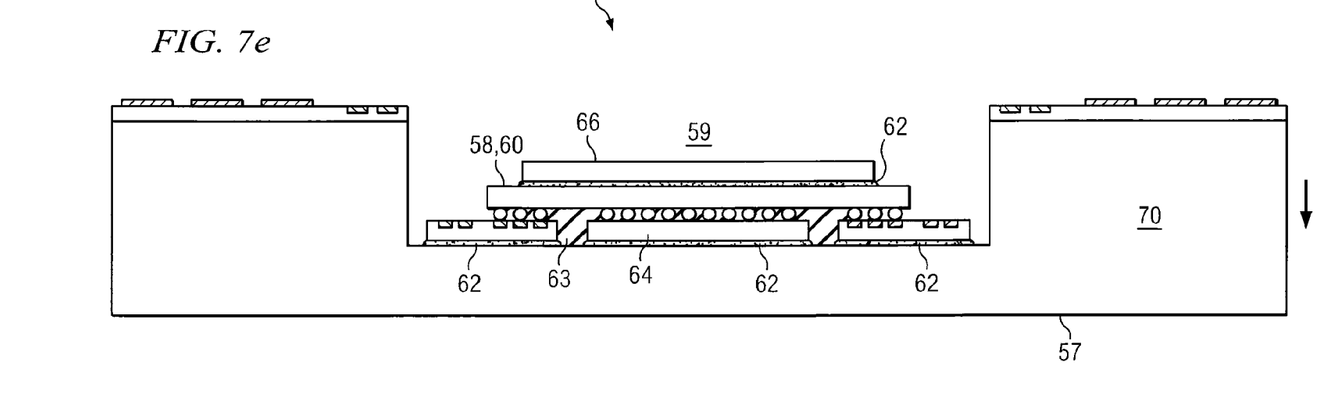
FIG. 7e illustrates a fifth step in an example method of manufacturing a semiconductor package as illustrated in FIG. 6.

FIG. 7a illustrates a first step in an example method of manufacturing a semiconductor package as illustrated in FIG. 6. A modified thermally-enhanced substrate 57 is provided, the substrate 57 having a heat sink 70 with an integrated cavity 59 again as shown to accommodate package 58. Film or adhesive material 62 is disposed on the thermally-enhanced substrate 57 as shown. In FIG. 7b, a KGU flip chip CSMP 58 is attached to the material 62. As a next step, FIG. 7c depicts underfill material 63 disposed between dies 60, 64. FIG. 7d depicts the following step of applying a film/adhesive material 62 on the top surface of die 60, where FIG. 7e shows die 66 attached to die 60 as a next step.

Figure 7F:
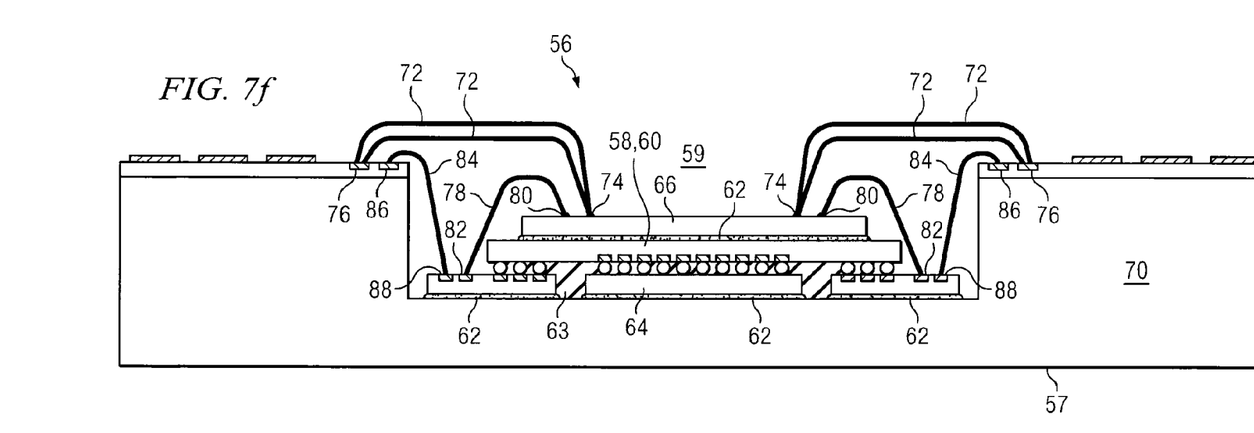
FIG. 7f illustrates a sixth step in an example method of manufacturing a semiconductor package as illustrated in FIG. 6.
Figure 7G:
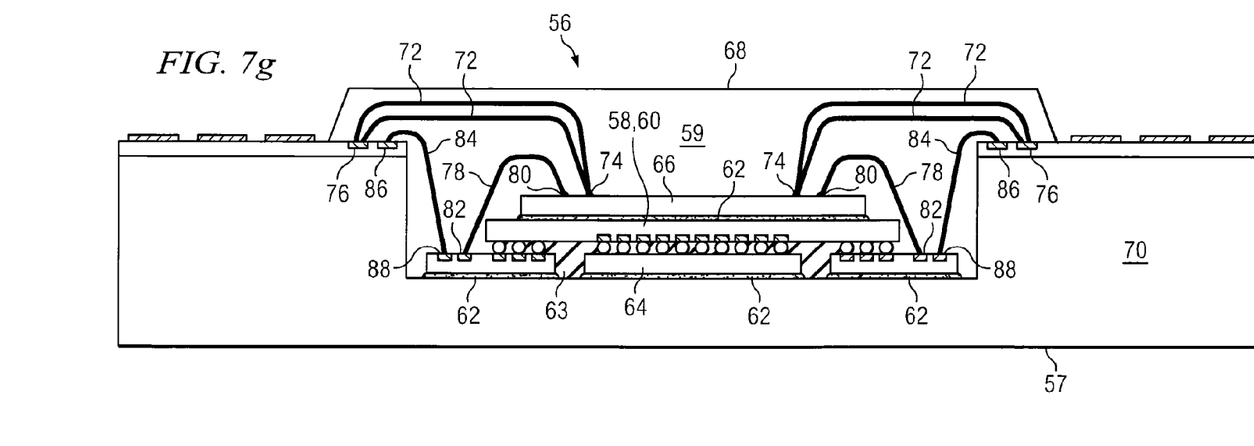
FIG. 7g illustrates a seventh step in an example method of manufacturing a semiconductor package as illustrated in FIG. 6.
Figure 7H:
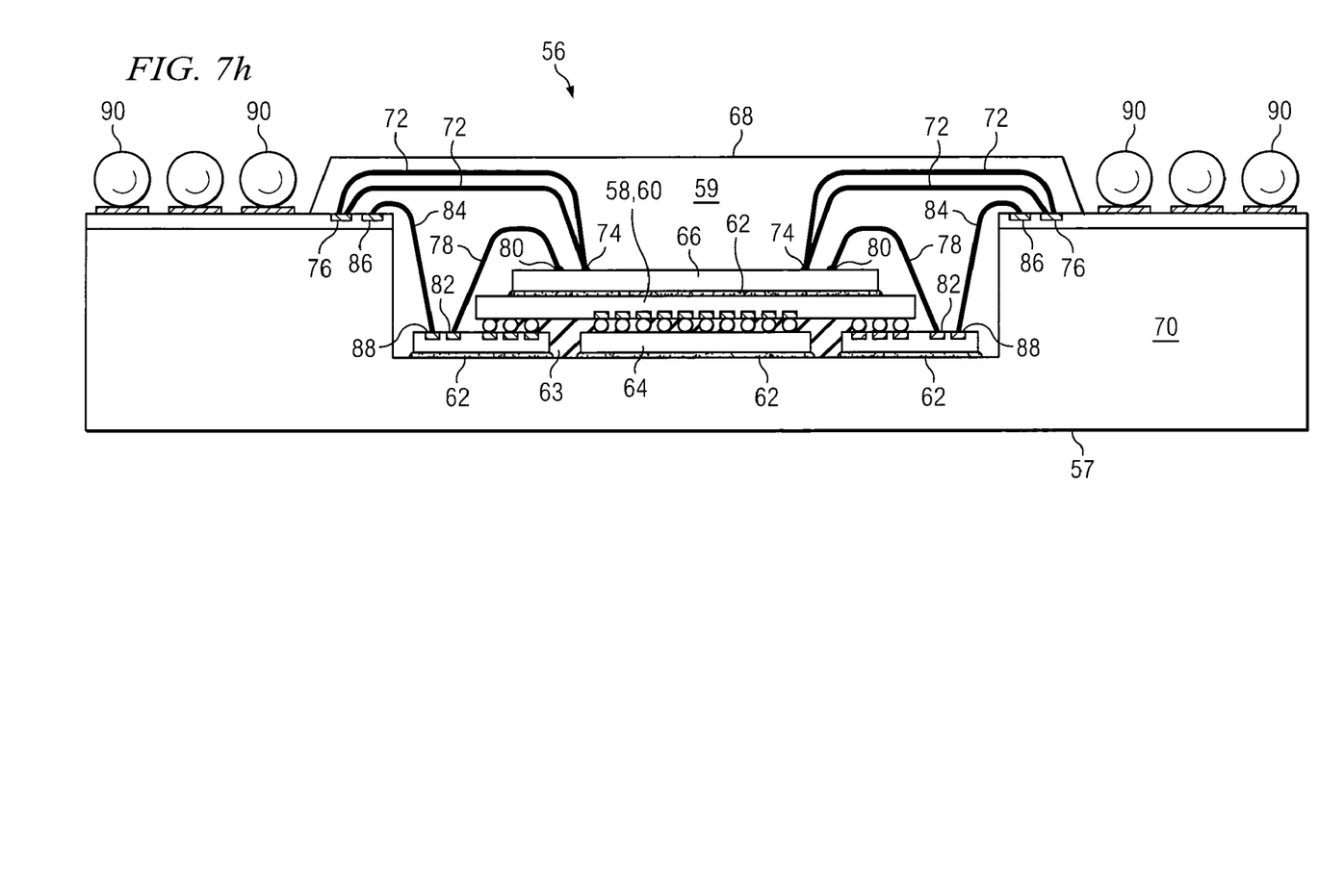
FIG. 7h illustrates a eighth step in an example method of manufacturing a semiconductor package as illustrated in FIG. 6.

As a next step, the various wirebonding as previously described takes place as shown in FIG. 7f. Package 58 with dies 60, 64 is then encapsulated/overmolded with encapsulant 68 as depicted in FIG. 7g. As a next step, FIG. 7h depicts solder balls 90 attached to the modified thermally-enhanced substrate 57 to provide connectivity to external circuitry.

Figure 8A:
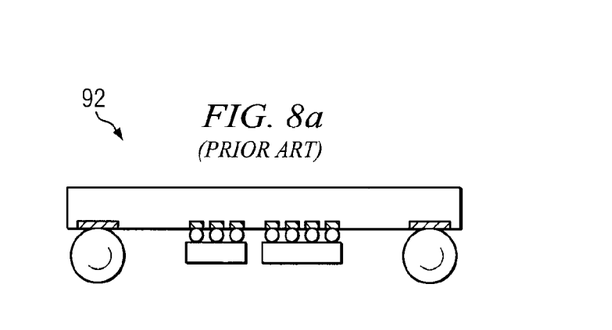
FIG. 8a illustrates an example prior art "Known Good" wafer level chip scale package/chip scale module package (WLCSP-CSMP)
Figure 8B:
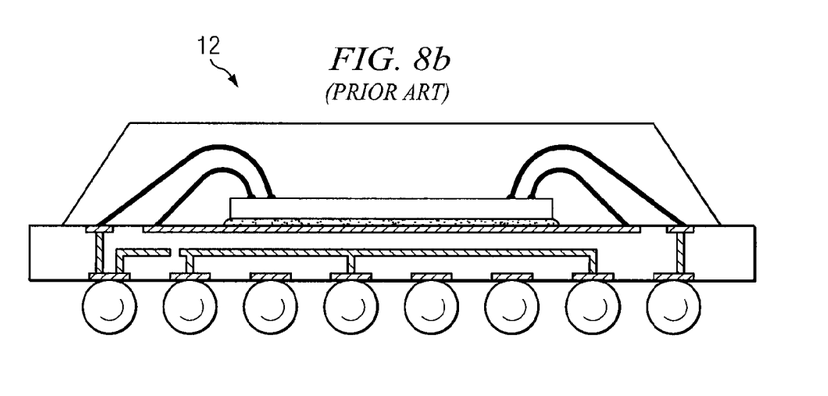
FIG. 8b illustrates an example prior art BGA package.

In an additional embodiment, a "Known Good" WLCSP-CSMP can be modified to be incorporated into a modified BGA package to perform specific functionality for a particular application. Again, for purposes of conceptual illustration, FIG. 8a illustrates an example prior art "Known Good" WLCSP-CSMP 92. FIG. 8b illustrates an example prior art BGA package 12.

Figure 9:
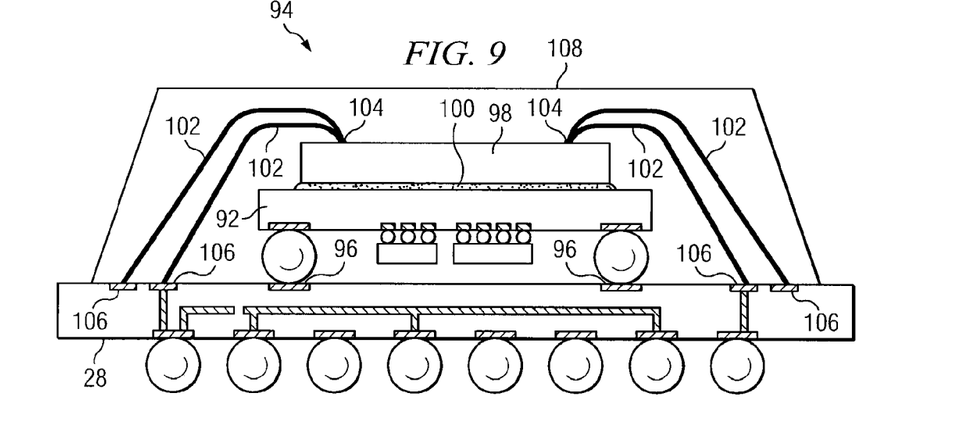
FIG. 9 illustrates an example embodiment of a semiconductor package having an incorporated BGA package together with a KGU WLCSP-CSMP package.

FIG. 9 illustrates an example embodiment of a semiconductor package 94 having an incorporated modified BGA package 12 together with a modified KGU WLCSP-CSMP package. The WLCSP-CSMP is attached on the BGA substrate 28 by an adhesive material, solder paste, or flux-reflow material. An additional application die 98 is disposed at the backside of the IPD die 92 by using adhesive material 100. Additional dies 92 can be stacked on die 92 depending upon the application. Here, as before, dies 92 can include ICs, IPDs, or any combination thereof.

Connectivity of the modified WLCSP-CSMP to the BGA substrate 28 can be performed by wirebonds 102 connecting bond pads 104 located as part of die 98 to pads 106 connected to metal circuitry incorporated into BGA substrate 28. Additionally, junction 96 provides electrical connectivity between solder balls of the modified WLCSP-CSMP and additional pads 106 also connected to metal circuitry of the BGA substrate 28.

Package 94 can be constructed using standard molding or TOP mold gate techniques. The package 94 provides enhanced device functionality due to combining favorable aspects of the WLCSP-CSMP and BGA package designs for applications such as WLAN, Bluetooth, DSP, chipsets, and a host of related applications.

Package 94 adds passive function integration through the use of IPDs 98 as application dies 98 which are incorporated on the modified CSMP module as previously depicted without the requirement of using a standard external passive component.

In summary, the use of packages such as package 94, package 56, and package 14 provides enhanced functionality and serves to take advantage of positive aspects of older designs, which are modified to create the packages 94, 56, and 14.

While one or more embodiments of the present invention have been illustrated in detail, the skilled artisan will appreciate that modifications and adaptations to those embodiments may be made without departing from the scope of the present invention as set forth in the following claims.

What is claimed is:

1. A semiconductor device, comprising:
   a ball grid array (BGA) substrate including integrated metal layers;
   a plurality of first interconnects connected to the integrated metal layers of the BGA substrate;
   a known good chip scale module package (CSMP) electrically coupled to the first interconnects, wherein the CSMP includes:
   (a) a second substrate including a cutout area,
   (b) a plurality of second interconnects electrically coupled to a first surface of the second substrate,
   (c) a first semiconductor die mounted over the second substrate and electrically coupled to the plurality of second interconnects, (d) a plurality of third interconnects electrically coupled to a first surface of the first semiconductor die, (e) a second semiconductor die disposed in the cutout area of the second substrate and electrically coupled to the third interconnects, wherein a surface of the second semiconductor die opposite the third interconnects contacts the BGA substrate for thermal dissipation, and (f) an underfill material deposited between the first semiconductor die and second semiconductor die;

a third semiconductor die mounted over the CSMP;

a plurality of fourth interconnects electrically coupled between the third semiconductor die and the second substrate; and a plurality of fifth interconnects electrically coupled between the third semiconductor die and the BGA substrate.

2. The semiconductor device of claim 1, wherein the plurality of first interconnects comprises an adhesive material, including solder paste, solder flux, or conductive epoxy.

3. The semiconductor device of claim 1, further including an encapsulant deposited over the fourth and fifth interconnects, the third semiconductor die, the CSMP, and the BGA substrate.

4. The semiconductor device of claim 1, wherein the plurality of fourth and fifth interconnects includes wire bonds.

5. The semiconductor device of claim 1, wherein the CSMP is disposed in a cavity of the BGA substrate.

6. A semiconductor device, comprising:
a first substrate including integrated metal layers;
a known good chip scale module package (CSMP) electrically coupled to the first substrate;
a first semiconductor die disposed over the CSMP;
a first bond wire extending from the first semiconductor die to the first substrate;
a second bond wire extending from the first semiconductor die to the CSMP;
a second substrate including a cutout area;
a second semiconductor die disposed over the second substrate; and
a third semiconductor die disposed in the cutout area of the second substrate and mounted to the second semiconductor die.

7. The semiconductor device of claim 6, further including an underfill material disposed between the second semiconductor die and third semiconductor die.

8. The semiconductor device of claim 6, further including a plurality of first interconnects electrically connecting the first substrate to the CSMP.

9. The semiconductor device of claim 6, further including an encapsulant deposited over the first semiconductor die, the CSMP, and the first substrate.

10. The semiconductor device of claim 6, wherein the CSMP is disposed in a cavity of the first substrate.

11. The semiconductor device of claim 6, wherein a surface of the third semiconductor die contacts the first substrate for thermal dissipation.

12. A semiconductor device, comprising:
a first substrate;
a plurality of first interconnects electrically coupled to the first substrate;
a second substrate including a cutout area completely through the second substrate, the second substrate electrically coupled to the first interconnects;
a first semiconductor die disposed over the second substrate;
a plurality of second interconnects electrically coupled to the second substrate and first semiconductor die;
a second semiconductor die disposed in the cutout area of the second substrate;
a plurality of third interconnects electrically coupled to the second semiconductor die and first semiconductor die;
a third semiconductor die disposed over the first semiconductor die;
a first bond wire formed between the third semiconductor die and the first substrate; and
a second bond wire formed between the third semiconductor die and the second substrate.

13. The semiconductor device of claim 12, wherein a surface of the third semiconductor die contacts the first substrate for thermal dissipation.

14. The semiconductor device of claim 12, further including a plurality of bumps formed over the first substrate.

15. The semiconductor device of claim 12, further including an encapsulant deposited over the first semiconductor die, third semiconductor die, first substrate, second substrate, first bond wire, and second bond wire.

* * * * *